(12) United States Patent
Tagami et al.

(10) Patent No.: US 9,318,330 B2
(45) Date of Patent: Apr. 19, 2016

(54) PATTERNING PROCESS METHOD FOR SEMICONDUCTOR DEVICES

(71) Applicant: RENESAS ELECTRONICS CORPORATION, Kawasaki-shi, Kanagawa (JP)

(72) Inventors: Masayoshi Tagami, Kanagawa (JP); Naoya Inoue, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 11 days.

(21) Appl. No.: 14/141,042

(22) Filed: Dec. 26, 2013

(65) Prior Publication Data

US 2014/0187047 A1 Jul. 3, 2014

Related U.S. Application Data

(60) Provisional application No. 61/746,395, filed on Dec. 27, 2012.

(51) Int. Cl.
| | |
|---|---|
| H01L 21/027 | (2006.01) |
| H01L 21/033 | (2006.01) |
| H01L 21/311 | (2006.01) |
| H01L 21/768 | (2006.01) |

(52) U.S. Cl.
CPC ........ *H01L 21/0337* (2013.01); *H01L 21/0276* (2013.01); *H01L 21/31144* (2013.01); *H01L 21/76816* (2013.01)

(58) Field of Classification Search
CPC ..................... H01L 21/0337; H01L 21/31144; H01L 21/0276
USPC ................................... 438/689, 694, 700, 758
See application file for complete search history.

(56) References Cited

U.S. PATENT DOCUMENTS

| | | | | |
|---|---|---|---|---|
| 7,687,339 | B1 * | 3/2010 | Schultz et al. | 438/197 |
| 7,699,996 | B2 | 4/2010 | Furukawa et al. | |
| 8,158,334 | B2 * | 4/2012 | Gabor et al. | 430/314 |
| 8,183,159 | B2 | 5/2012 | Furukawa et al. | |
| 8,785,327 | B2 * | 7/2014 | Kikutani | 438/703 |

(Continued)

FOREIGN PATENT DOCUMENTS

WO 2012/128843 A2 9/2012

OTHER PUBLICATIONS

Yong Kong Stew, et al., "Integration of 20nm Half Pitch Single Damascene Copper Trenches by Spacer-Defined Double Patterning (SDDP) on Metal Hard Mask (MHM)", Applied Materials, IEEE, Leuven, Belgium, 2010, pp. 1-3.

*Primary Examiner* — Michele Fan
(74) *Attorney, Agent, or Firm* — Sughrue Mion, PLLC

(57) ABSTRACT

A method for forming a semiconductor device that includes a SiARC layer formed over a photoresist film which is formed over spacer portions which are formed on a spacer assist layer which is formed over a hard mask layer. The SiARC layer has an etch rate substantially similar to the etch rate of the spacer assist layer. The photoresist layer and the SiARC layer are removed from a first region to expose the spacer portions and the spacer assist layer. The SiARC layer in the second region and the exposed spacer assist layer in the first region are simultaneously etched leaving remaining spacer portions and remaining spacer assist layer portions. A part of the hard mask layer is etched to form hard mask portions in the first region using the remaining spacer portions and the remaining spacer assist layer portions as an etching mask.

20 Claims, 8 Drawing Sheets

(56) References Cited

U.S. PATENT DOCUMENTS

| | | | |
|---|---|---|---|
| 2006/0046484 A1* | 3/2006 | Abatchev et al. | 438/689 |
| 2006/0178019 A1* | 8/2006 | Senzaki et al. | 438/788 |
| 2006/0211260 A1* | 9/2006 | Tran et al. | 438/763 |
| 2007/0148968 A1* | 6/2007 | Kwon et al. | 438/671 |
| 2008/0006852 A1 | 1/2008 | Beintner et al. | |
| 2008/0124931 A1* | 5/2008 | Lee et al. | 438/692 |
| 2008/0241734 A1* | 10/2008 | Liu et al. | 430/253 |
| 2009/0035584 A1* | 2/2009 | Tran et al. | 428/446 |
| 2010/0048024 A1* | 2/2010 | Sugimura | 438/702 |
| 2010/0093173 A1* | 4/2010 | Park et al. | 438/689 |
| 2010/0155906 A1* | 6/2010 | Lee et al. | 257/623 |
| 2010/0267238 A1* | 10/2010 | Johnson et al. | 438/692 |
| 2011/0014791 A1* | 1/2011 | Johnson et al. | 438/696 |
| 2011/0021026 A1* | 1/2011 | Luning et al. | 438/692 |
| 2011/0059403 A1* | 3/2011 | Sukekawa | 430/312 |
| 2011/0111596 A1 | 5/2011 | Kanakasabapathy | |
| 2011/0250757 A1* | 10/2011 | Sukekawa et al. | 438/703 |
| 2012/0021607 A1* | 1/2012 | Huang et al. | 438/703 |
| 2012/0129316 A1* | 5/2012 | Jung | 438/421 |
| 2013/0175637 A1* | 7/2013 | Chang | 257/383 |
| 2013/0178067 A1* | 7/2013 | Yu et al. | 438/699 |
| 2013/0264622 A1* | 10/2013 | Lin et al. | 257/314 |

* cited by examiner

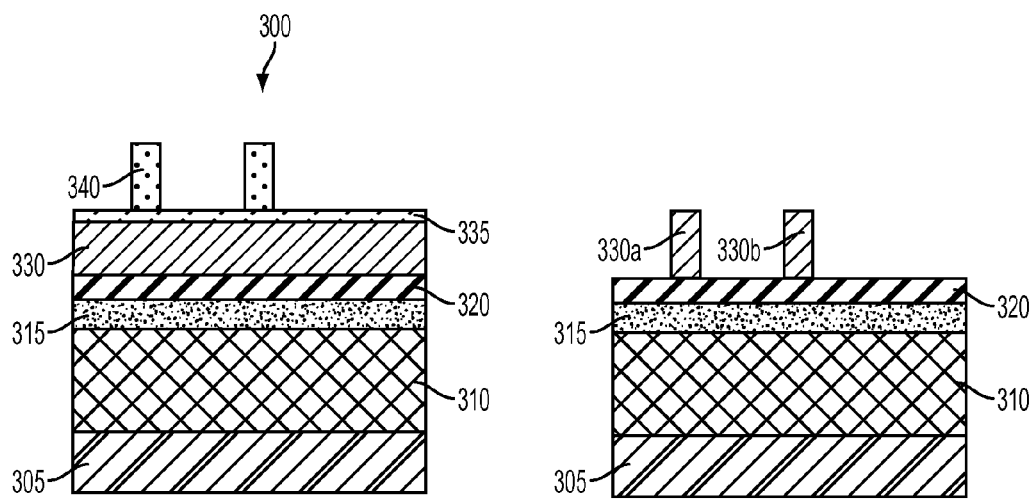
FIG. 3A
COMPARATIVE ART
FIG. 3B
COMPARATIVE ART
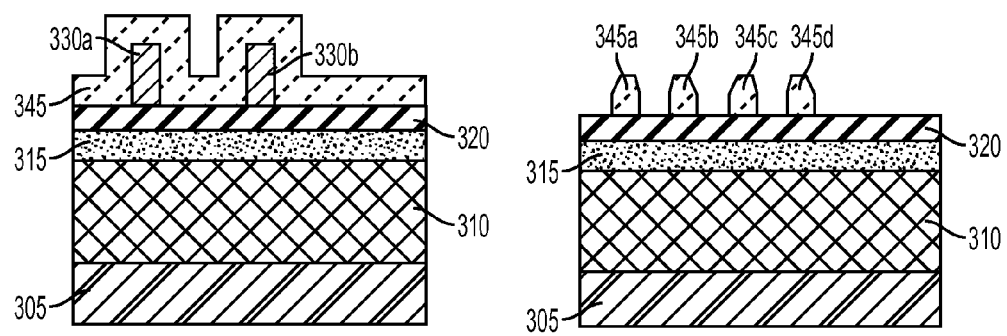
FIG. 3C
COMPARATIVE ART
FIG. 3D
COMPARATIVE ART

COMPARATIVE ART

COMPARATIVE ART

COMPARATIVE ART

COMPARATIVE ART

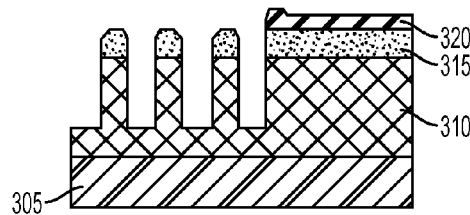
FIG. 3I
COMPARATIVE ART
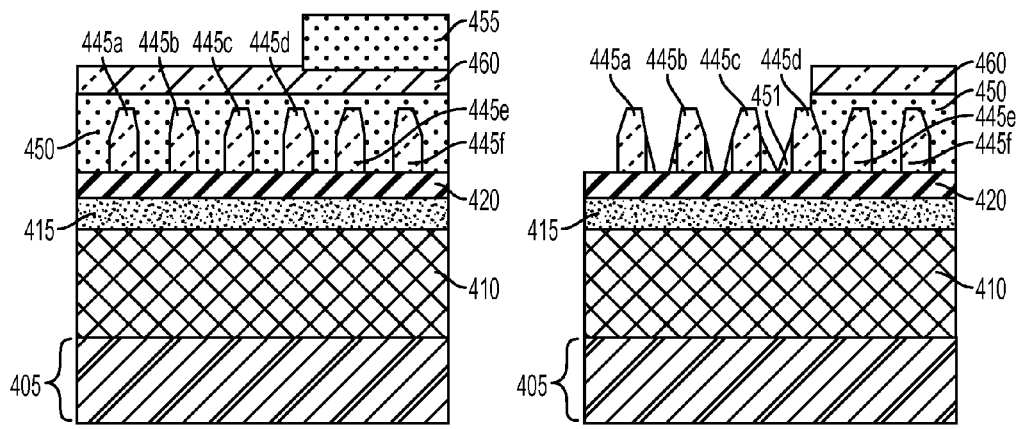
FIG. 4A
COMPARATIVE ART
FIG. 4B
COMPARATIVE ART
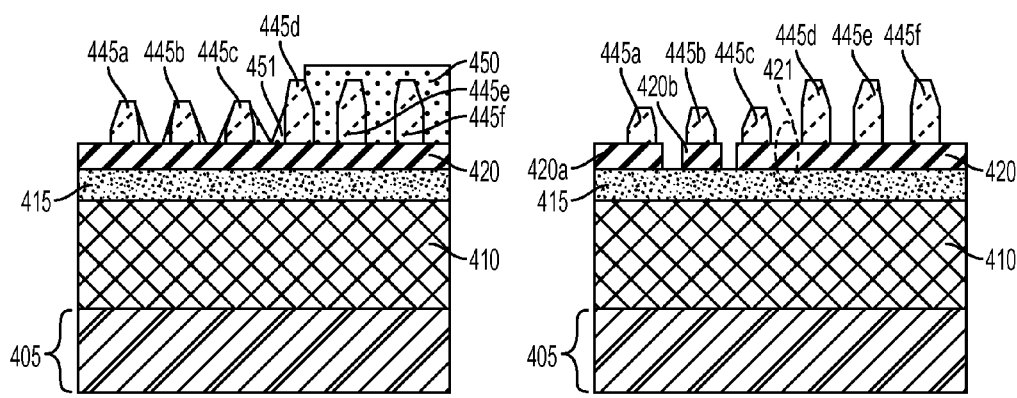
FIG. 4C
COMPARATIVE ART
FIG. 4D
COMPARATIVE ART

PATTERNING PROCESS METHOD FOR SEMICONDUCTOR DEVICES

BACKGROUND

1. Field of the Invention

The present application relates to methods of making integrated circuits. More specifically it relates to methods of fabricating semiconductor devices using sidewall image transfer (SIT) patterning processes.

2. Description of the Related Art

Manufacturing of semiconductor devices generally involves performing various steps of device patterning processes. For example, the manufacturing of a semiconductor device may start with using computer aided design (CAD) generated device patterns and then duplicating those patterns onto a substrate to form individual semiconductor devices. The duplication process may involve using various exposing techniques (e.g. photolithography) in combination with a variety of subtractive (e.g. etching) and additive (e.g. deposition) material processing steps.

For example, in a photolithography process, a layer of photoresist material may be first applied to a substrate, and then selectively exposed using a predetermined device pattern. More specifically, the photoresist may be deposited on the substrate, then portions of the photoresist selectively exposed to light or other ionizing radiation (e.g., ultraviolet, electron beam, x-ray, etc) using the predetermined device pattern. The light or other ionizing radiation can cause the photoresist to undergo a change in solubility with respect to certain chemical solutions. After the photoresist has been exposed using the light or other ionizing radiation, it can then be developed using a developer solution to remove non-irradiated (in so-called "negative resist situations") or the radiated (in so-called "positive resist situations") portions of the photoresist layer to reproduce the predetermined device pattern in the photoresist. Further, the photoresist pattern subsequently may then be copied or transferred to the substrate underneath the photoresist pattern.

As the space available for semiconductor devices has continued to decrease, semiconductor manufacturers have been challenged to meet the demand for ever increasing device density. One technique for sub-80 nm pitch patterning has been to use a technique called sidewall image transfer (SIT), also known as sidewall spacer image transfer, to achieve a pattern density twice that achievable using previous techniques. A conventional SIT process involves forming a mandrel layer on a hard mask layer then forming a spacer layer conformably over the mandrel and hard mask layers. Then, the spacer is etched back followed by pulling out the mandrel layer. In certain applications a series of layers of an Organic Planarization Layer (OPL), a Silicon Anti-reflective Coating (SiARC) layer, and a photoresist layer are then formed over the spacer layer in sequence and the photoresist layer patterned to form a block area and a non-block area. After the photoresist layer is patterned, the photoresist layer is etched and removed in the non-block area. Then metal hard mask etching process is performed during which the SiARC layer is first etched back to expose the OPL layer in the block area. Then, the metal hard mask in the non-block area is etched simultaneously with the spacer and OPL in the block area. Finally, the OPL in the block area is removed by an ashing process.

However, there can be some problems with the above process. For example, as discussed in more detail below, a low temperature silicon dioxide (LTO) can be used as the spacer. In such a situation, the LTO spacer inadvertently also can be etched back during the SiARC etch back step because LTO and SiARC films have similar material properties and etch at similar rates. This inadvertent etching of the LTO spacer can cause the spacer height to be reduced and the side-profile of the spacer to be rounded. As a result, the short, round-shaped spacer can cause a poor metal hard mask etching profile and produce critical dimension (CD) change. This poor metal hard mask profile can reduce the yield and reliability of the resulting semiconductor device due to degradation of interconnects formed by the SIT process.

Attempts to solve this problem include using SiN as the spacer film, rather than LTO, since SiN can have higher etch selectivity than LTO. Due to its higher etch selectivity, using the SiN spacer can keep the spacer layer thick enough during the hard mask etching to maintain a good metal hard mask profile. However, the SiN spacer layer requires the use of high deposition temperatures, over 400 degrees, which can cause degradation of the mandrel layer formed of an OPL existing directly under the SiN spacer layer.

Another attempt to solve the problem includes using a thicker mandrel layer so that the spacer profile remains high enough even after the SiARC etch back step so the profile of the metal hard mask is not degraded during that etch back step. However, making the mandrel layer thicker results in the profile having a high aspect ratio due to tall narrow spacers. This type of profile makes it difficult to effectively remove the OPL during the OPL removal step. As a result it is necessary to aggressively over etch during the OPL removal step causing the OPL mask to shrink in the block area generating pattern defect issues. If over etching is not preformed some of the OPL remains between the spacers which can lead to faulty patterning in the hard mask layer which can prevent some trenches from being properly formed.

Accordingly, there is a need to improve the metal hard mask etching profile produced during SIT patterning processes to increase the yield and reliability of semiconductor devices.

SUMMARY

The present application provides novel methods for making semiconductor devices using various exposing techniques in combination with a variety of subtractive (e.g. etching) and additive (e.g. deposition) material processing steps.

Aspects of certain example embodiments include a method for forming a semiconductor device that includes obtaining a wafer, the wafer including a silicon anti-reflective coating (SiARC) layer formed over a photoresist film which is formed over spacer portions which are formed on a spacer assist layer which is formed over a hard mask layer, wherein the SiARC layer has an etch rate substantially similar to an etch rate of the spacer assist layer. The method includes removing the photoresist layer and the SiARC layer from a first region of the wafer exposing the spacer portions and portions of the spacer assist layer; simultaneously etching the SiARC layer in a second region of the wafer and the exposed spacer assist layer in the first region of the wafer leaving remaining spacer portions and remaining spacer assist layer portions; and etching a part of the hard mask layer to form hard mask portions in the first region, using the remaining spacer portions and the remaining spacer assist layer portions as an etching mask.

According to another aspect of an example embodiment a method of forming a semiconductor device includes obtaining a wafer in which the wafer includes a semiconductor substrate; a hard mask layer formed over the semiconductor substrate; a spacer assist layer formed over the hard mask layer; a mandrel layer formed over the spacer assist layer; and a spacer layer formed over the mandrel layer. The method further includes etching a portion of the spacer layer and removing portions of the mandrel layer to form spacer portions. A photoresist film is formed over the spacer portions. An anti-reflective coating layer is formed over the photoresist film in which the anti-reflective coating layer has an etch rate substantially equal to an etch rate of the spacer assist layer. The photoresist film and the anti-reflective coating layer are removed from a first region of the wafer to expose the spacer portions and the spacer assist layer, while simultaneously preventing removal of the photoresist film and the anti-reflective coating layer in a second region of the wafer. The method further includes simultaneously etching the anti-reflective coating layer in the second region and the exposed spacer assist layer in the first region leaving remaining spacer portions and remaining spacer assist layer portions. A part of the hard mask layer is etched to form hard mask portions in the first region using the remaining spacer portions and the remaining spacer assist layer portions as an etching mask.

According to yet another aspect of an embodiment, a method for forming a semiconductor device includes obtaining a wafer in which the wafer comprises a first layer; a second layer having a first etch rate; a third layer comprising spacer portions formed on the second layer; a fourth layer formed over the spacer portions of the third layer; and a fifth layer formed over the fourth layer, the fifth layer having an etch rate substantially similar to the first etch rate. The method includes removing the fourth layer from a first region of the wafer to expose the spacer portions of the third layer and portions of the second layer, and simultaneously preventing removal of the fourth layer and fifth layer in a second region of the wafer. The method further includes simultaneously etching the fourth layer in the second region and the exposed portions of the second layer in the first region leaving remaining spacer portions of the third layer and remaining second layer portions. A part of the first layer is etched to form mask portions in the first region using the remaining spacer portions of the third layer and the remaining spacer portions of the third layer as an etching mask.

These and other features, aspects, and advantages will become better understood with reference to the following description and claims.

BRIEF DESCRIPTION OF THE DRAWINGS

The accompanying drawings, which are incorporated in and constitute a part of this specification, exemplify example embodiments and, together with the description, serve to explain and illustrate the principles, aspects and features of the invention.

FIGS. 3A-3I show a semiconductor being manufactured at different steps of a process of forming a semiconductor device according to a first comparative example using a conventional process.

FIGS. 4A-4D show a semiconductor being manufactured at different steps of a process of forming a semiconductor device according to a second comparative example using a conventional process.

DETAILED DESCRIPTION

In the following detailed description, reference will be made to the accompanying drawings, in which identical functional elements are designated with like numerals. The aforementioned accompanying drawings show by way of illustration and not by way of limitation, specific embodiments and implementations consistent with the principles of the invention. These embodiments and implementations are described in sufficient detail to enable those skilled in the art to practice the invention and it is to be understood that other embodiments and implementations may be utilized and that structural changes and/or substitutions of various elements may be made without departing from the scope and spirit of the invention.

Example Embodiment for Forming a Metal Hard Mask Layer

Figure 1:
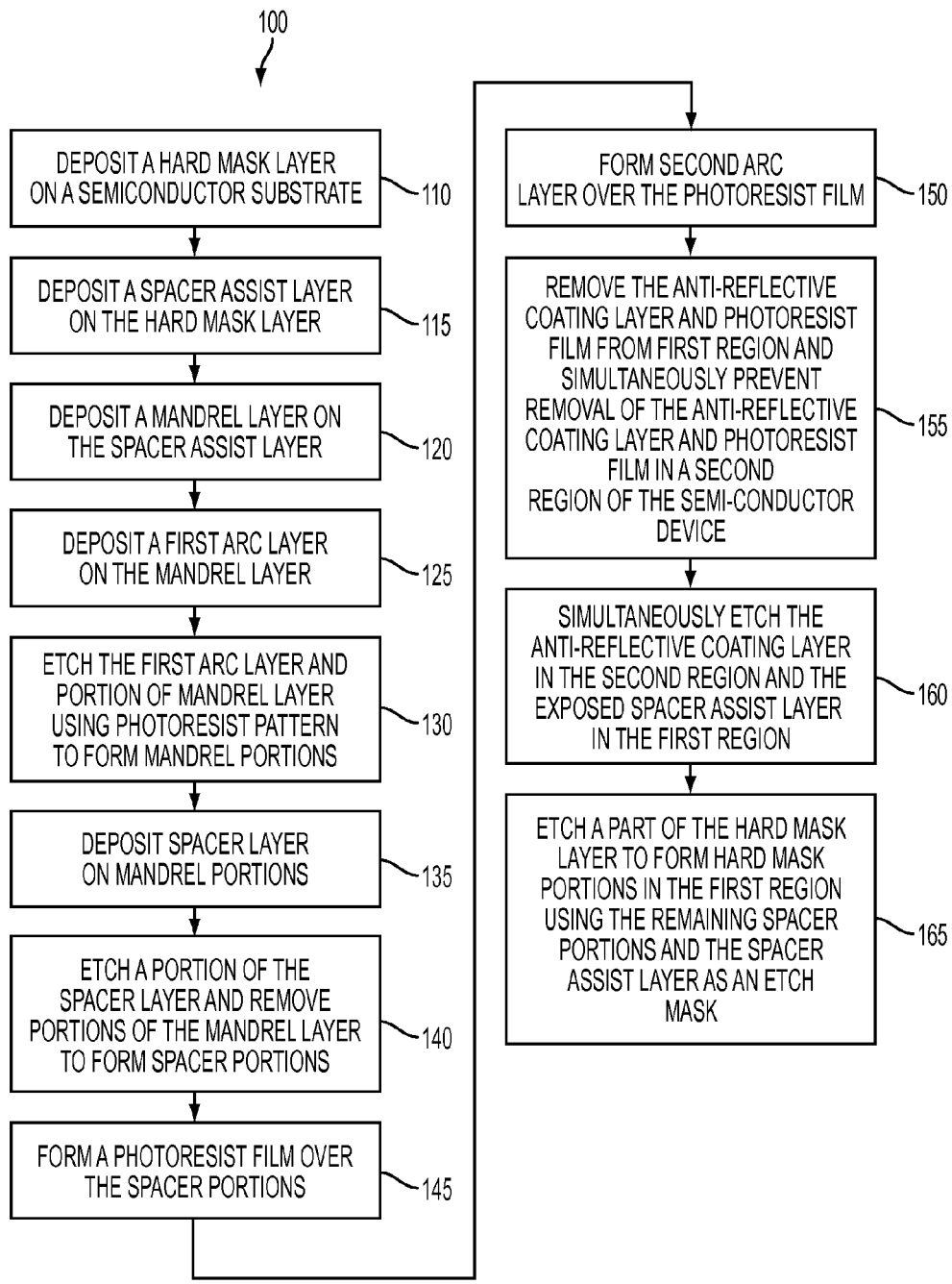
FIG. 1 is a flowchart showing a process of forming a metal hard mask semiconductor device according to an embodiment of the invention.

FIG. 1 illustrates the steps in a process 100 of forming a metal hard mask semiconductor device according to an example embodiment of the present invention and with reference to FIGS. 2A-2I.

In step 110, a metal hard mask layer 220 is formed over a semiconductor substrate 205. In some embodiments, the substrate 205 is formed from silicon (Si) and the metal hard mask layer 220 is formed of titanium nitride TiN. The TiN layer 220 may be deposited onto the substrate 205 using a physical vapor deposition (PVD) process. For example, the TiN layer 220 may be deposited using a sputtering process. As would be apparent to a person of ordinary skill in the art, alternative processes could be used and alternative materials may be selected for the metal hard mask layer and the substrate. The metal hard mask layer 220 can be accompanied by a dielectric material forming a dielectric hard mask 215, disposed adjacent to the metal hard mask layer 220. The dielectric hard mask 215 can be formed using chemical vapor deposition (CVD) in temperature range of 150-400° C. An intermediate layer 210, such as a low-k dielectric layer, can be disposed between the substrate 205 and the hard mask layer 220.

After the metal hard mask layer 220 is formed in step 110, a spacer assist layer 225 is formed on top of the metal hard mask layer in step 115. The space assist layer 225 is described in more detail below.

In step 120 a mandrel layer 230 is formed on the spacer assist layer 225. The mandrel layer 230 can be formed from an optical planarizing layer (OPL) material, although other materials, as is known in the art, may be used for the mandrel layer such as a photoresist material, amorphous silicon, or silicon nitride. The OPL mandrel layer 230 can be formed by a spin-coating process.

In step 125, a first anti-reflective coating(ARC) layer 235 is formed on the mandrel layer 230. In some embodiments, the first ARC layer 235 can be formed from a silicon containing anti-reflective coating (SiARC) material, although other materials may be used for the first ARC layer. The first ARC layer 235 can be formed by depositing the first ARC layer on the mandrel layer 230 with a spin-coating process.

The resulting structure is a wafer 200 obtained by depositing these layers, from the silicon substrate 205 through the first ARC layer 235, in sequence.

A photoresist pattern 240 is formed on the first ARC layer 235 using known techniques to create mandrel portions from the mandrel layer 230.

In step 130, the first ARC layer 235 and a portion of the mandrel layer 230 are removed by an etching process using the photoresist pattern 240 as a mask. The resulting structure is shown in FIG. 2B, in which mandrel portions 230*a* and 230*b* are formed from the mandrel layer.

Figure 2A:
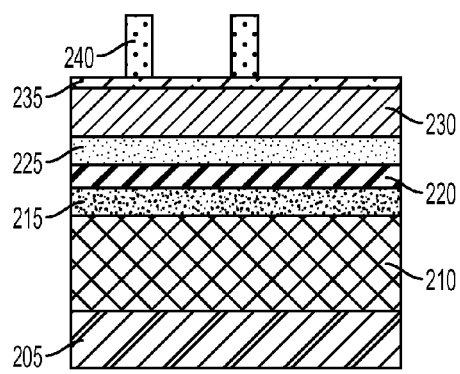
FIGS. 2A-2I show a semiconductor device being manufactured at different steps of a process of forming a semiconductor device according to an embodiment of the present invention.
Figure 2B:
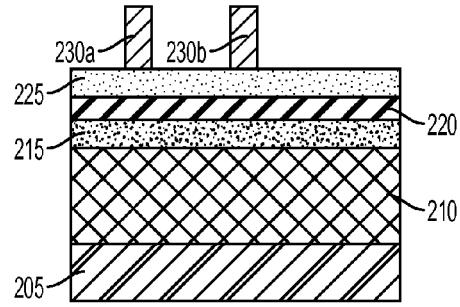
Figure 2C:
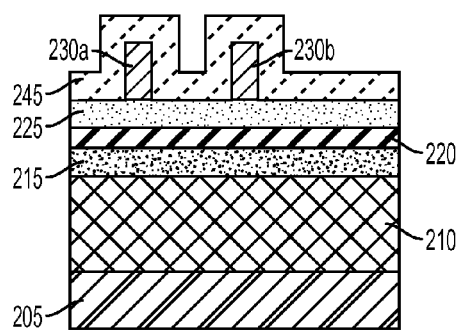

In step 135, a spacer layer 245 is formed on the mandrel portions and portions of the spacer assist layer 225, as shown in FIG. 2C. The spacer layer 245 can be made of an LTO material and deposited using a CVD process at a temperature of about 150-250° C.

Figure 2D:
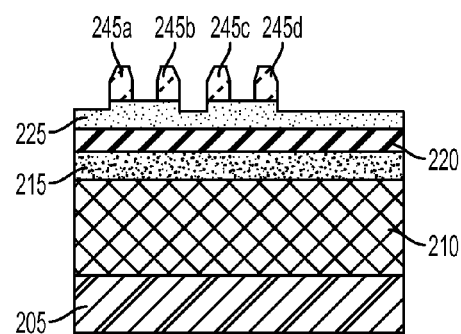

In step 140, a portion of the spacer layer 245 and the mandrel portions 230*a* and 230*b* are etched to form patterned spacer portions 245*a-d*, as shown in FIG. 2D. A reactive ion etching (RIE) process can be used to etch the LTO spacer layer 245 and mandrel portions 230*a* and 230*b*.

In step 145, an OPL photoresist film 250 is formed on the patterned spacer portions 245*a-d* using a spin coating process.

Figure 2E:
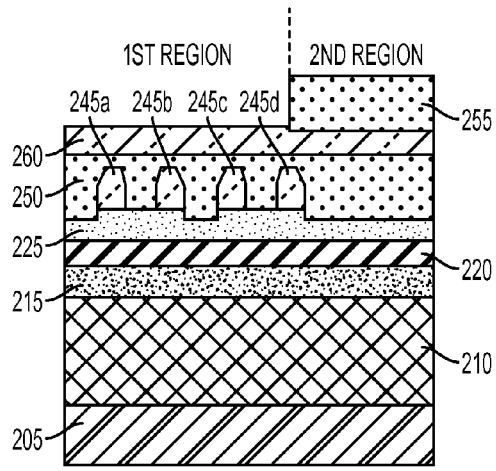

In step 150, a second ARC layer 260, which can be formed from an SiARC material, and another photoresist film 255 are formed on the OPL photoresist film 250 using a spin coating process. The second ARC layer 260, referred to in this embodiment as the SiARC layer 260, is formed over a first region and a second region of the wafer, whereas the photoresist film 255 is formed only over the second region of the wafer, as shown in FIG. 2E, in order to create a block area. In certain embodiments, the SiARC layer 260 has a thickness that is the same or slightly larger than the thickness of the spacer assist layer 225. The photoresist film 255 is developed using a lithography process (e.g. ArF immersion process) to be a mask. The resulting structure is shown in FIG. 2E.

Figure 2F:
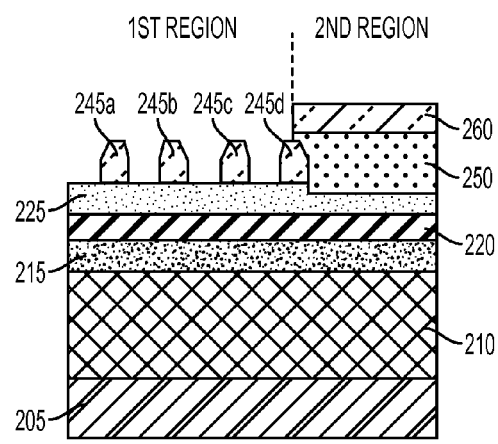

In step 155, the SiARC layer 260 and the OPL photoresist film 250 in the first region of the wafer are removed by an RIE process. At the same time, the developed photoresist film 255 acts as a mask over the second region of the wafer to prevent removal of the OPL photoresist film 250 and the SiARC layer 260 in the second region to create the block area. The etching results in the spacer portions 245*a-c* being exposed, as shown in FIG. 2F.

The spacer assist layer 225 is formed from a material with a substantially similar etch rate as the second SiARC layer 260. For example, if the second ARC layer 260 is formed from SiARC, the spacer assist layer 225 can be formed from a LTO silicon dioxide (SiO$_2$) as it has a similar etch rate as SiARC. The SiO$_2$ layer can be formed using a CVD process on the hard mask layer 220. Other materials such as SiCN and SiN can be used as the spacer assist layer, although they have a slightly slower etch rate than the SiARC layer 260 yet can be acceptable in some applications. Still other materials can be used for the spacer assist layer 225 as long as the material has a substantially similar etch rate as the second ARC layer 260.

Because the spacer assist layer 225 is disposed below the spacer portions 245*a-c*, the height of the spacer portions 245*a-c* is kept small reducing the aspect ratio of the spacers compared with conventional techniques. This smaller aspect ratio results in a more reliable etching of the OPL photoresist film 250 between the spacers.

Figure 2G:
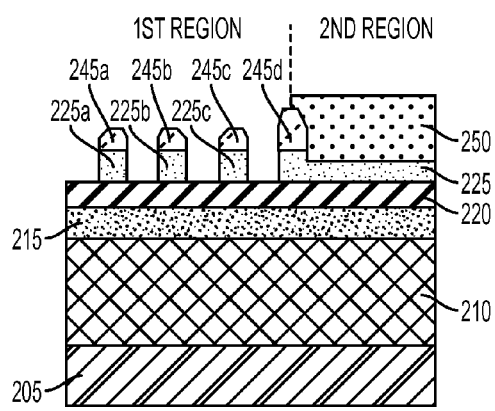

In step 160, the SiARC layer 260 in the second region and the exposed spacer portions 245*a-c* and spacer assist layer 225 in the first region are etched. Because the spacer assist layer 225 has substantially the same etch rate as the SiARC layer 260, the spacer assist layer 225 is fully etched at the same time the SiARC layer 260 is etched, without requiring over etching. The exposed spacer portions 245*a-c* are reduced in size but portions of them remain disposed on top of the remaining portions of the etched spacer assist layer 225*a-c* in the first region, as shown in FIG. 2G. These remaining spacer portions 245*a-c* and the remaining portions of the etched spacer assist layer 225*a-c* form spacers that serve as a mask for subsequent etching of the hard mask layer 220. Because the spacer assist layer 225 is disposed under the spacer portions 245*a-c* and because the spacer assist layer 225 has an etch rate that is substantially similar to the etch rate of the SiARC layer 260, the total height of the resulting spacers increases in comparison to the height of the spacers formed according to a conventional technique. This structure results in spacers that form a mask that effectively achieves a hard mask pattern that has the desired profile yet prevents excess OPL from remaining between the spacers during the OPL etch back step, thus preventing errors in the patterning of the hard mask layer 220.

Figure 2H:
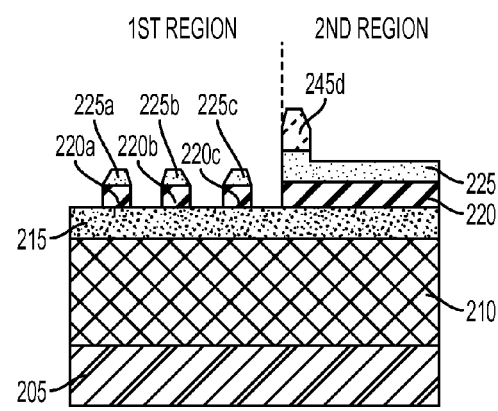

In step 165, the hard mask layer 220 in the first region and the OPL photoresist layer 250 in the second region are etched using an RIE process. Because the spacers formed by the remaining spacer portions 245*a-c* and the remaining spacer assist layer portions 225*a-c* in the first region serve as a mask, portions of the hard mask layer 220*a-c* remain in the first region, as shown in FIG. 2H. The remaining portions of the hard mask layer 220*a-c* are protected from the etching by those spacers. A portion of the spacer portions 245*a-c* remains disposed on top of the portions of the hard mask layer 220*a-c*, which serves to protect the profile of the remaining portions of the hard mask layer 220*a-c* during subsequent etching. The OPL photoresist layer 250 is removed by an ashing process. The resulting structure is shown in FIG. 2H.

Figure 2I:
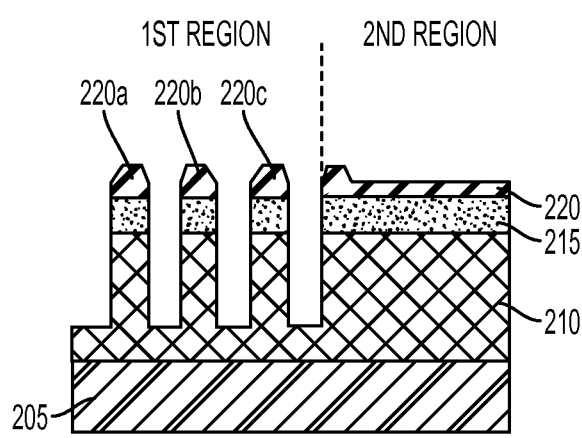
Figure 5:
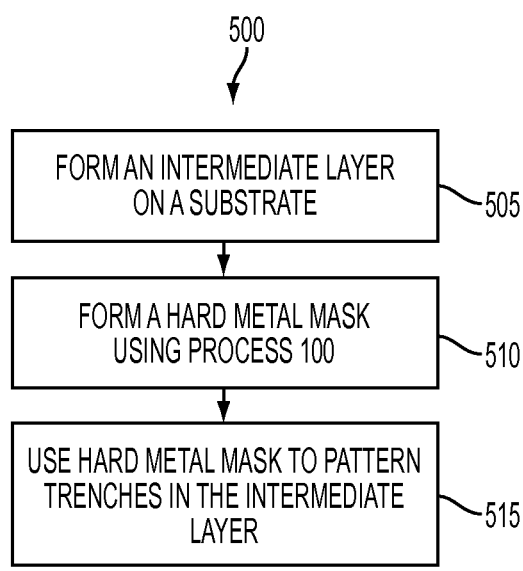
FIG. 5 is a flowchart showing a process of using the metal hard mask formed using the process of FIG. 1 to form a semiconductor device.

In another embodiment, illustrated in FIG. 5, a method 500 is performed in which an intermediate layer, such as the low-k dielectric layer 210 shown in FIG. 2A, is formed on the substrate 205 in step 505. In step 510 a hard metal mask is formed using the process 100 illustrated in FIG. 1. Subsequently, step 515, illustrated in FIG. 5, is performed in which trenches are formed by etching the low-k dielectric layer 210 using the remaining portions of the hard mask layer 220*a-c* and the remaining spacer assist portions 245*a-c* as a mask. Because the remaining portions of the hard mask layer 220*a-c* are protected from etching by the remaining spacer assist portions 225*a-c*, the profile of the hard mask portions 220*a-c* remains intact resulting in well formed trenches, as shown in FIG. 2I.

FIRST COMPARATIVE EXAMPLE

A first comparative example is provided to illustrate an effect of the inventive techniques described here. The first comparative example is illustrated in FIGS. 3A-I in which a similar semiconductor device is made but without employing a spacer assist layer. The result is a structure that has a hard mask pattern formed with a poor profile which can result in critical dimension (CD) change and low yield and reliability due to degradation of the interconnects formed by this process.

In FIG. 3A, a semiconductor device is created from a wafer 300 that includes, in sequence, a semiconductor substrate 305, a low-k dielectric layer 310, a hard mask layer formed from a dielectric hard mask layer 315 and a metal hard mask layer 320, a mandrel layer 330 formed of OPL, and a first ARC layer 335 formed on the mandrel layer 330, and formed from a SiARC material. A photoresist pattern 340 is formed on the first ARC layer 335.

The first ARC layer 335 and mandrel layer 330 are etched using the photoresist pattern 340 as a mask to form mandrel portions 330*a* and 330*b* and exposing parts of the hard mask layer 320, as shown in FIG. 3B.

A spacer layer 345 formed of LTO is deposited over the mandrel portions 330a-b and the exposed areas of the hard mask layer 320, as shown in FIG. 3C.

The spacer layer 345 and the mandrel portions 330a-b are etched, removing the mandrel portions and parts of the spacer layer 345 leaving patterned spacer portions 345a-d, as shown in FIG. 3D.

Figure 3E:
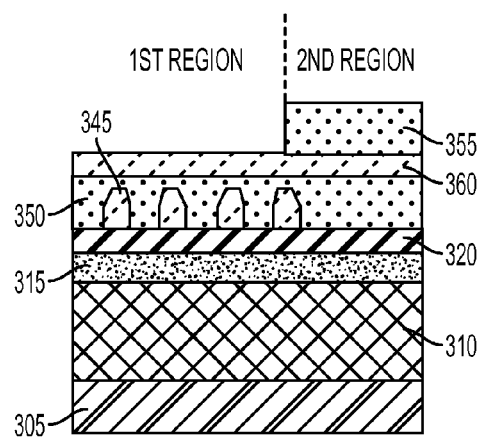

An OPL photoresist film 350 is formed on the patterned spacer portions 345a-d and a second SiARC layer 360, and another photoresist film 355 are formed on the OPL photoresist film 350. Second SiARC layer 360 is formed over a first region and a second region of the wafer, whereas the photoresist film 355 is formed only over the second region of the wafer, as shown in FIG. 3E, in order to create a block area. The photoresist film 355 is developed using a lithography process (e.g. ArF immersion process) to be a mask.

Figure 3F:
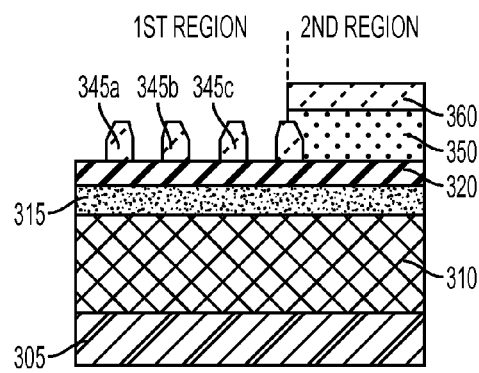

The second SiARC layer 360 and the photoresist film 350 in the first region on the wafer are removed by an etching process. At the same time, the developed photoresist film 355 acts as a mask over the second region of the wafer to prevent removal of the OPL photoresist film 350 and the second SiARC layer 360 in the second region to create the block area. The etching results in the spacer portions 345a-c being exposed, as shown in FIG. 3F.

Figure 3G:
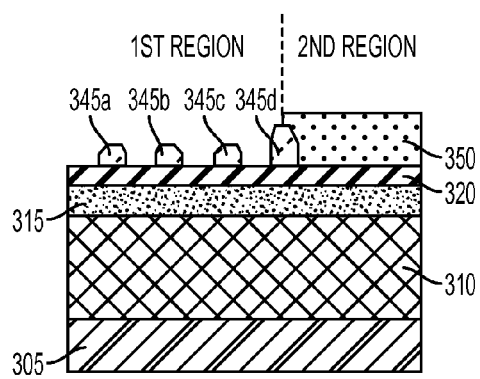

Next, the second SiARC layer 360 in the second region and the exposed spacer portions 345a-c in the first region are etched. As seen in FIG. 3G. the exposed spacer portions 345a-c are reduced in size and have a rounded shape as a result of the etching, although portions of them remain disposed on top of the hard mask layer 320. These remaining spacer portions 345a-c serve as a mask for subsequent etching of the hard mask layer 320. Due to the etching of the second SiARC layer 360 and the simultaneous etching of the exposed spacer portions 345a-c, the total height of the remaining spacer portions 345a-c is small and the shape of those portions is rounded. This structure results in spacers that form a mask that does not achieve an effective hard mask pattern with the desired profile, which can cause errors in the patterning of the hard mask layer 320.

Figure 3H:
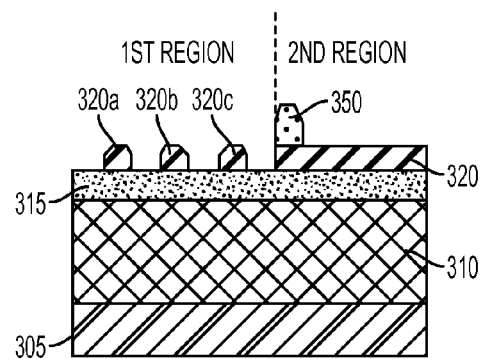

Next, the hard mask layer 320 in the first region and the OPL photoresist layer 350 in the second region are etched. Because the spacers formed by the remaining spacer portions 345a-c serve as a mask, portions of the hard mask layer 320a-c remain in the first region. However, because the spacer portions 345a-c in FIG. 3G are relatively small and have a rounded shape, the etching to form the hard mask pattern mask over etches the hard mask layer 320 resulting in leaving portions of the hard mask layer 320a-c that do not have the desired profile since the tops of the portions of the hard mask layer 320a-c are rounded, as shown in FIG. 3H. The OPL photoresist layer 350 is then removed by an ashing process and the resulting structure is shown in FIG. 3H.

In a subsequent step, trenches are formed by etching the low-k dielectric layer 310 using the remaining portions of the hard mask layer 320a-c as a mask, as shown in FIG. 3I. However, the remaining portions of the hard mask layer 320a-c do not have the desired profile which can result in CD change and a reduction in yield and reliability problems due to interconnect degradation. In comparison, the embodiment shown in FIGS. 2A-I does not suffer from such problems.

SECOND COMPARATIVE EXAMPLE

A second comparative example is provided to illustrate an effect of the inventive techniques described here. The second comparative example is illustrated in FIGS. 4A-D in which a semiconductor device, somewhat similar to the device shown in FIGS. 2A-I, is made but without employing a spacer assist layer and with a thicker mandrel layer to produce taller spacers in an effort to avoid the problems with the first comparative example. The result is a structure that is susceptible to defects being formed because the hard mask can be formed unreliably causing a low yield and reliability.

FIG. 4A shows a wafer 400 similar to wafer 300 shown in FIG. 3E, except that the mandrel layer is thicker than the mandrel layer in the first comparative example. This results in taller spacer portions 445a-f, shown in FIG. 4A, in an effort to overcome the problems in the first comparative example in which the spacer portions were too short resulting in misshapen hard mask pattern portions.

The layers in the wafer 400 shown in FIG. 4A include, in sequence, a semiconductor substrate 405, a low-k dielectric layer 410, a hard mask layer formed from a dielectric hard mask layer 415 and a metal hard mask layer 420, and patterned spacer portions 445a-f.

An OPL photoresist film 450 is formed on the patterned spacer portions 445a-f and a SiARC layer 460, and another photoresist film 455 are formed on the OPL photoresist film 450. The SiARC layer 460 is formed over both a first region and a second region of the wafer, whereas the photoresist film 455 is formed only over the second region of the wafer, as shown in FIG. 4A, in order to create a block area. The photoresist film 455 is developed using a lithography process (e.g. ArF immersion process) to be a mask.

The SiARC layer 460 and the OPL photoresist film 450 in the first region on the wafer are removed by an etching process. At the same time, the developed photoresist film 455 acts as a mask over the second region of the wafer to prevent removal of the OPL photoresist film 450 and the SiARC layer 460 in the second region to create the block area. The etching results in the spacer portions 445a-c being exposed, as shown in FIG. 4B. However, because the patterned spacer portions 445a-c are taller than the corresponding spacer portions 345a-c in the first comparative embodiment, the aspect ratio of the spacer portions is higher. Because of the high aspect ratio/narrow spacers in this second comparative example, it is difficult to pull out all of the OPL photoresist film 450 from between the spacers during the etching process. This can leave remaining portions of OPL photoresist 451 between the spacers which can lead to an incompletely formed hard mask pattern. To completely remove the OPL photoresist 450 from between the spacers the OPL photoresist 450 can be over etched. However, such aggressive over etching results in OPL mask shrinkage in the block area and can generate pattern defect issues.

Next, the SiARC layer 460 in the second region and the exposed spacer portions 445a-c in the first region are etched. As seen in FIG. 4C, although the exposed spacer portions 445a-c are reduced in size, because they began taller than in the first comparative example, a sufficient amount of the spacer portions 445a-c can remain to achieve the hard mask profile. However, because some material 451 can still remain between the spacers, this remaining OPL photoresist can cause errors in the hard mask pattern. The remaining spacer portions 445a-c serve as a mask for subsequent etching of the hard mask layer 420, but the remaining OPL photoresist material 451 also acts as a mask during the etching of the hard mask layer 420.

Next, the hard mask layer 420 in the first region and the OPL photoresist layer 450 in the second region, shown in FIG. 4C, are etched. Because the remaining spacer portions 445a-c serve as a mask, portions of the hard mask layer 420a-b remain in the first region. However, because the remaining OPL photoresist material 451 also acts as a mask, the hard mask layer between spacer portions 445c and 445d is not etched, as shown at area 421 in FIG. 4D. This results in an error in the hard mask pattern and reduced yield and reliability. In comparison, the embodiment shown in FIGS. 2A-I does not suffer from such hard mask pattern errors.

Although a few example embodiments have been shown and described, these example embodiments are provided to convey the subject matter described herein to those who are familiar with this field. It should be understood that the subject matter described herein may be embodied in various forms without being limited to the described embodiments. The subject matter described herein can be practiced without those specifically defined or described matters or with other or different elements or matters not described. It will be appreciated by those familiar with this field that changes may be made in these embodiments without departing from spirit and scope of the invention as described herein and as defined in the appended claims and their equivalents.

Aspects related to the embodiments described here have been set forth in part in the description above, and in part should be apparent from the description, or may be learned by practice of the invention. Aspects of the embodiments may be realized and attained by means of the elements and combinations of various elements and aspects particularly pointed out in the detailed description and the appended claims. It is to be understood that both the foregoing descriptions are exemplary and explanatory only and are not intended to be limiting.

What is claimed is:

1. A method for forming a semiconductor device comprising:
   obtaining a wafer, the wafer comprising an anti-reflective coating (ARC) layer formed over a photoresist layer which is formed over spacer portions which are formed on a spacer assist layer which is formed over a hard mask layer, wherein the ARC layer has an etch rate substantially similar to an etch rate of the spacer assist layer;
   removing the photoresist layer and the ARC layer from a first region of the wafer exposing the spacer portions and portions of the spacer assist layer while leaving the photoresist layer in a second region of the wafer, the photoresist layer in the second region of the wafer contacting a spacer portion in the second region;
   simultaneously etching the ARC layer in a second region of the wafer and the exposed spacer assist layer in the first region of the wafer leaving remaining spacer portions and remaining spacer assist layer portions; and
   etching a part of the hard mask layer to form hard mask portions in the first region, using the remaining spacer portions and the remaining spacer assist layer portions as an etching mask.

2. The method according to claim 1, wherein the anti-reflective coating layer is formed from a silicon anti-reflective coating (SiARC) material.

3. A method for forming a semiconductor device comprising:
   obtaining a wafer, the wafer comprising:
   a semiconductor substrate;
   a hard mask layer formed over the semiconductor substrate;
   a spacer assist layer formed over the hard mask layer;
   a mandrel layer formed over the spacer assist layer; and
   a spacer layer formed over the mandrel layer;
   etching a portion of the spacer layer and removing portions of the mandrel layer to form spacer portions;
   forming a photoresist film over the spacer portions;
   forming an anti-reflective coating layer over the photoresist film, the anti-reflective coating layer having an etch rate substantially equal to an etch rate of the spacer assist layer;
   removing the photoresist film and the anti-reflective coating layer from a first region of the wafer to expose the spacer portions and the spacer assist layer and simultaneously preventing removal of the photoresist film and the anti-reflective coating layer in a second region of the wafer;
   simultaneously etching the anti-reflective coating layer in the second region and the exposed spacer assist layer in the first region leaving remaining spacer portions and remaining spacer assist layer portions; and
   etching a part of the hard mask layer to form hard mask portions in the first region using the remaining spacer portions and the remaining spacer assist layer portions as an etching mask.

4. The method for forming a semiconductor device according to claim 3, wherein the wafer further comprises an intermediate layer between the semiconductor substrate and the hard mask layer.

5. The method for forming a semiconductor device according to claim 4, the method further comprising etching the intermediate layer to form trenches in the intermediate layer by using the hard mask portions as a hard mask.

6. The method for forming a semiconductor device according to claim 3, wherein the spacer portions are formed by a method of sidewall image transfer patterning.

7. The method for forming a semiconductor device according to claim 3, wherein the obtaining the wafer comprises:
   depositing the hard mask layer over the semiconductor substrate;
   depositing the spacer assist layer on the hard mask layer;
   depositing the mandrel layer on the spacer assist layer; and
   depositing the spacer layer on the mandrel layer.

8. The method for forming a semiconductor device according to claim 3, wherein the spacer assist layer is formed of silicon oxide ($SiO_2$).

9. The method for forming a semiconductor device according to claim 8, wherein the spacer assist layer is formed of low temperature deposited silicon oxide (LTO).

10. The method for forming a semiconductor device according to claim 3, wherein the spacer assist layer is formed of silicon cyanide (SiCN).

11. The method for forming a semiconductor device according to claim 3, wherein the spacer assist layer is formed of silicon nitride (SiN).

12. The method for forming a semiconductor device according to claim 3, wherein the spacer layer is formed of low temperature deposited silicon oxide (LTO).

13. A method for forming a semiconductor device comprising:
   obtaining a wafer, the wafer comprising:
   a first layer comprised of a metal;
   a second layer having a first etch rate;
   a third layer comprising spacer portions formed on the second layer;
   a fourth layer formed over the spacer portions of the third layer; and
   a fifth layer formed over the fourth layer, the fifth layer having an etch rate substantially similar to the first etch rate;
   removing the fourth layer from a first region of the wafer to expose the spacer portions of the third layer and portions of the second layer, and simultaneously preventing removal of the fourth layer and fifth layer in a second region of the wafer, the fourth layer in the second region of the wafer contacting a spacer portion in the second region;

simultaneously etching the fifth layer in the second region and the exposed portions of the second layer in the first region leaving remaining spacer portions of the third layer and remaining second layer portions; and etching a part of the first layer to form mask portions in the first region using the remaining spacer portions of the third layer and the remaining second layer portions as an etching mask, wherein the third layer is comprised of a low temperature oxide (LTO).

14. The method for forming a semiconductor device according to claim 13, wherein:

the second layer is comprised of a silicon oxide;

the fourth layer is comprised of organic planarization layer (OPL) material; and the fifth layer is comprised of an anti-reflective coating (ARC) material.

15. The method for forming a semiconductor device according to claim 14, wherein the first layer is comprised of titanium nitride (TiN).

16. The method for forming a semiconductor device according to claim 14, wherein the second layer is comprised of $SiO_2$.

17. The method for forming a semiconductor device according to claim 16, wherein the second layer is formed of low temperature deposited silicon oxide (LTO).

18. The method for forming a semiconductor device according to claim 13, wherein the second layer is formed of silicon cyanide (SiCN).

19. The method for forming a semiconductor device according to claim 13, wherein the second layer is formed of silicon nitride (SiN).

20. The method for forming a semiconductor device according to claim 14, wherein the third layer is formed with a chemical vapor deposition (CVD) process at a temperature between about 150250 ° C.

\* \* \* \* \*